United States Patent
Ando et al.

[11] Patent Number: 6,118,468
[45] Date of Patent: Sep. 12, 2000

[54] IMAGE RECORDING APPARATUS

[75] Inventors: Shunichi Ando, Yokohama; Tadaaki Kanno, Yokosuka; Kazumi Ishima, Nagareyama; Keiichi Setani, Tokyo, all of Japan

[73] Assignee: Ricoh Company, Ltd., Japan

[21] Appl. No.: 08/874,007

[22] Filed: Jun. 13, 1997

[30] Foreign Application Priority Data

Jun. 13, 1996 [JP] Japan ................................. 8-172839
Jun. 5, 1997 [JP] Japan ................................. 9-162125

[51] Int. Cl.⁷ .................................................. B41J 15/16
[52] U.S. Cl. ......................... 347/218; 347/219; 347/223
[58] Field of Search ........................... 400/662; 347/220, 347/218, 219, 223

[56] References Cited

U.S. PATENT DOCUMENTS

| | | |
|---|---|---|
| 4,151,397 | 4/1979 | Boor, Jr. et al. . |
| 4,512,079 | 4/1985 | Leblond ................................. 346/136 |
| 4,780,729 | 10/1988 | Murakami et al. ..................... 347/220 |
| 4,819,011 | 4/1989 | Yokota ................................... 347/223 |
| 4,916,463 | 4/1990 | Tzeng et al. ........................... 347/220 |
| 4,928,134 | 5/1990 | Hasegawa et al. ..................... 347/220 |
| 5,357,271 | 10/1994 | Wiklof et al. . |

FOREIGN PATENT DOCUMENTS

| | | |
|---|---|---|
| 3427306 | 7/1985 | Germany . |
| 3802735 | 8/1989 | Germany . |
| 3919007 | 12/1990 | Germany . |
| 4433892 | 3/1995 | Germany . |
| 57-150586 | 12/1982 | Japan . |

OTHER PUBLICATIONS

German Patent Office Search Report Dated Mar. 10, 1998.

*Primary Examiner*—Huan Tran
*Attorney, Agent, or Firm*—Cooper & Dunham LLP

[57] ABSTRACT

An image recording apparatus for preparing a printing master film for textile printing includes an image recording unit including at least one thermal head for recording images on a recording material; a recording material transportation unit for transporting the recording material, including a platen roller for bringing the recording material into contact with the thermal head so as to for images or the recording material, and a back-up roller which is in pressure contact with the platen roller at an opposite position to the position where the recording material is brought into contact with the thermal heads by the platen roller; and a disk brake for controlling the rotation of the back-up roller, connected to the back-up roller.

6 Claims, 10 Drawing Sheets

IMAGE RECORDING APPARATUS

BACKGROUND OF THE INVENTION

1. Field of the Invention

The present invention relates to an image recording apparatus for preparing a printing master film for textile printing.

2. Discussion of Background

Recently, when textile printing is performed on textiles for apparel, ornaments and the like, a color design for printing on the textiles is read by a scanner, or a desired color image is formed on a display for a computer, and the thus read or formed color image is then subjected to color separation, so that each color-separated image is then converted into a corresponding image information for each color. Such image information is then input to an image formation apparatus provided with a thermal plotter comprising a thermal head, and the input image information is converted to images which are formed on an image formation film comprising a thermosensitive coloring material by the thermal head. Thus, an image-bearing film printing master film for color textile printing is prepared. Such films are now in general use because of the advantages over other printing masters that complicated image development and image fixing processes are unnecessary.

However, when the above-mentioned film is prepared for each color, a large size film, for example, an A0-size film, is generally used, so that if image density becomes uneven on such a large size film, and accordingly light transmission differs from place to place in the film, the film, which serves as a screen for image formation, cannot be used in practice, since image exposure cannot be properly performed through the film.

SUMMARY OF THE INVENTION

It is therefore an object of the present invention to provide an image recording apparatus for preparing a printing master film for textile printing, which printing master film is capable of forming images with uneven image density being minimized, capable of performing accurate image exposure for textile printing therethrough, free of shifting of images from the right position thereof.

This object of the present invention can be achieved by making uniform the distribution of temperature in an main scanning direction of an image recording section of the image recording apparatus, and by making uniform the contact of the film with a platen roller of the image recording apparatus, thereby achieving accurate registration of images.

More specifically, the above object of the present invention can be achieved by an image recording apparatus comprising an image recording unit comprising at least one thermal head for recording images on a recording material; a recording material transportation unit for transporting the recording material, comprising a platen roller for bringing the recording material into contact with the thermal head so as to form images on the recording material, and a back-up roller which is in pressure contact with the platen roller at an opposite position to the position where the recording material is brought into contact with the thermal head by the platen roller; and a disk brake for controlling the rotation of the back-up roller, connected to the back-up roller.

In the above image recording apparatus, it is preferable that the back-up roller be disposed in such a manner that the axis of rotation of the back-up roller is positioned downstream of the direction of transportation of the recording material with respect to a line connecting the contact point of the recording material with the platen roller and the axis or rotation of the platen roller.

Furthermore, the image recording apparatus may further comprise a tension-application roller, for instance, a grit roller, for applying tension to the recording material in the transport direction thereof, which is disposed downstream of the image recording unit with respect to the transportation direction of the recording material.

Furthermore, the above recording unit may further comprise a pressure-application adjustment unit for applying pressure to the thermal head in such direction that the thermal head is brought into pressure contact with the recording material, and for adjusting the pressure.

The image recording apparatus may further comprise a heat-uniformizing section comprising a heat dissipation block in which a heat pipe is built in.

The platen roller may comprise a rubber with a hardness of 40 to 50 degrees at least in an outer surface layer of the platen roller.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
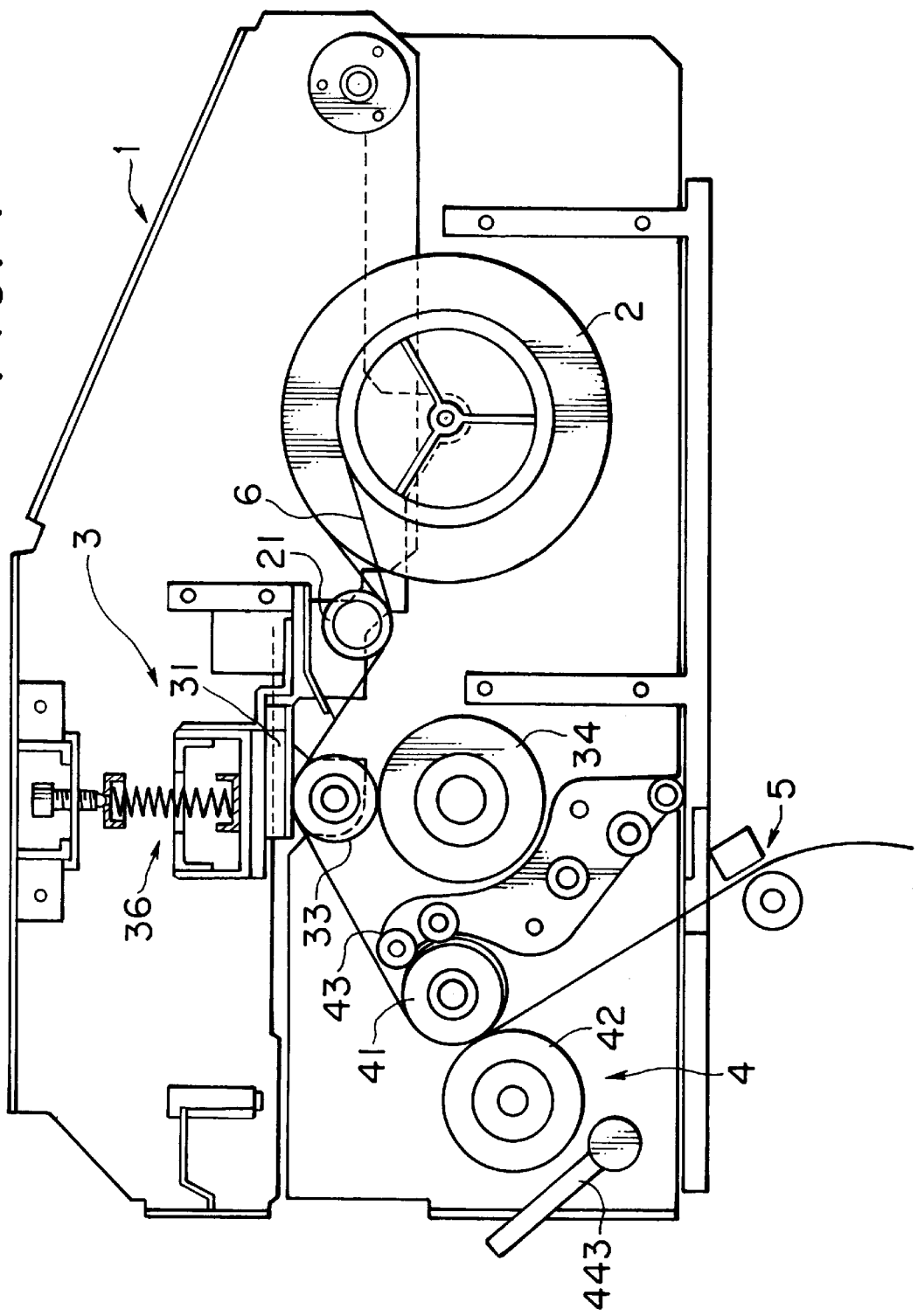
FIG. 1 is a schematic cross-sectional view of an image recording apparatus of the present invention.

With reference to FIG. 1, an image recording apparatus of the present invention, which may be referred to as a plotter, will now be explained.

As shown in FIG. 1, the plotter 1 comprises a roll film supporting section 2, an image recording section 3, a recording film transport section 4, and a cutting section 5.

The roll film supporting section 2 comprises a roll of a recording material, for instance, a A0-size color thermochromic film capable of inducing color formation therein, using a leuco dye, which can be used as a printing master film for textile color printing, which is referred to as a CTC film 6 in FIG. 1, and a tension adjusting unit 21 for adjusting the tension applied to the CTC film 6 during the transportation thereof.

In FIG. 1, reference numeral 31 indicates a recording unit; reference numeral 33, a platen roller; reference numeral 34, a back-up roller; reference numeral 36, a pressure adjustment unit 36; reference numeral 41, a grit roller; reference numeral 42, a pressure application roller; reference numeral 43, a holding roller; and reference numeral 443, a pressure application and release lever.

Figure 2:
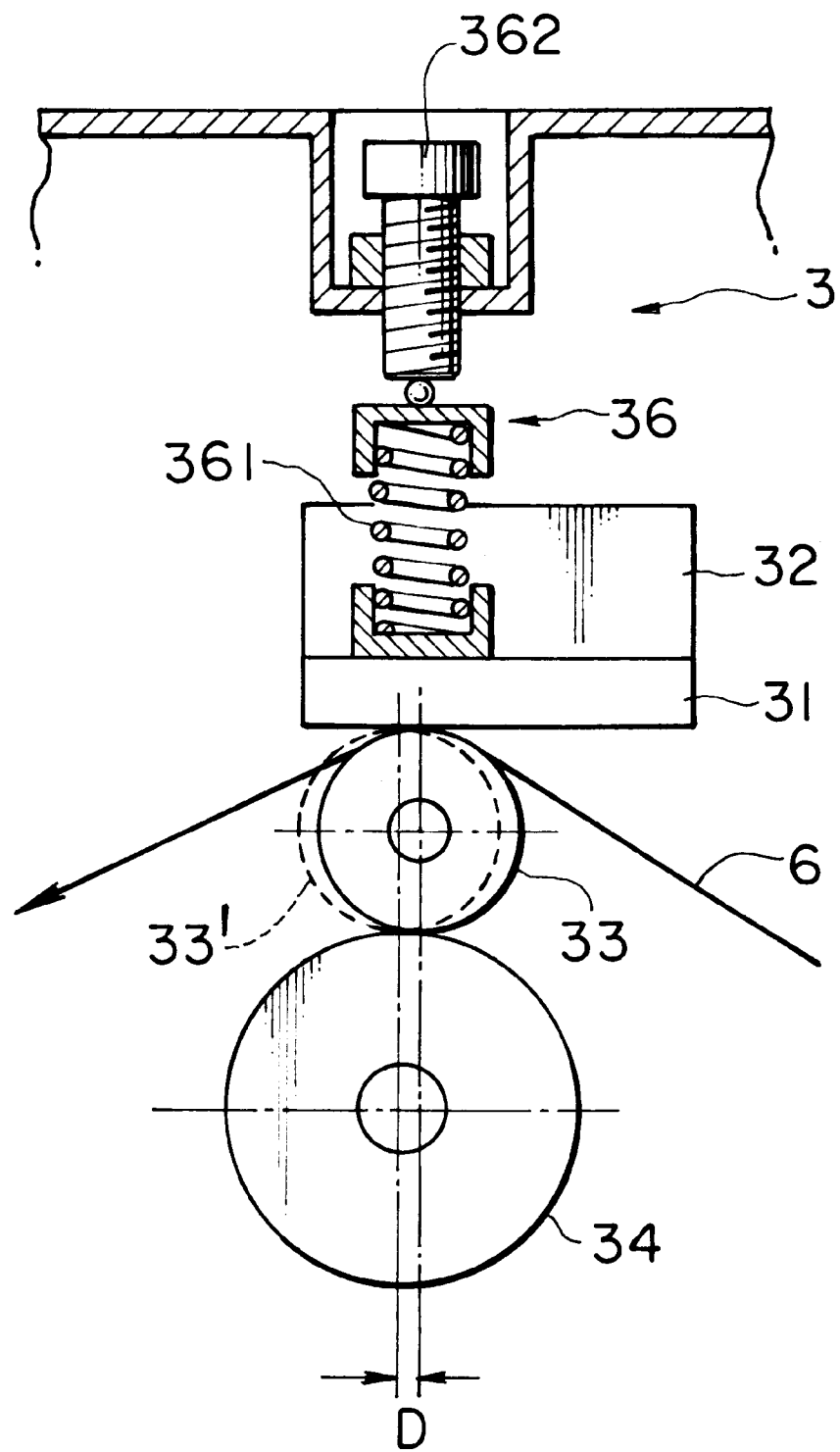
FIG. 2 is a schematic cross-sectional side view of the image recording apparatus shown in FIG. 1.
Figure 3:
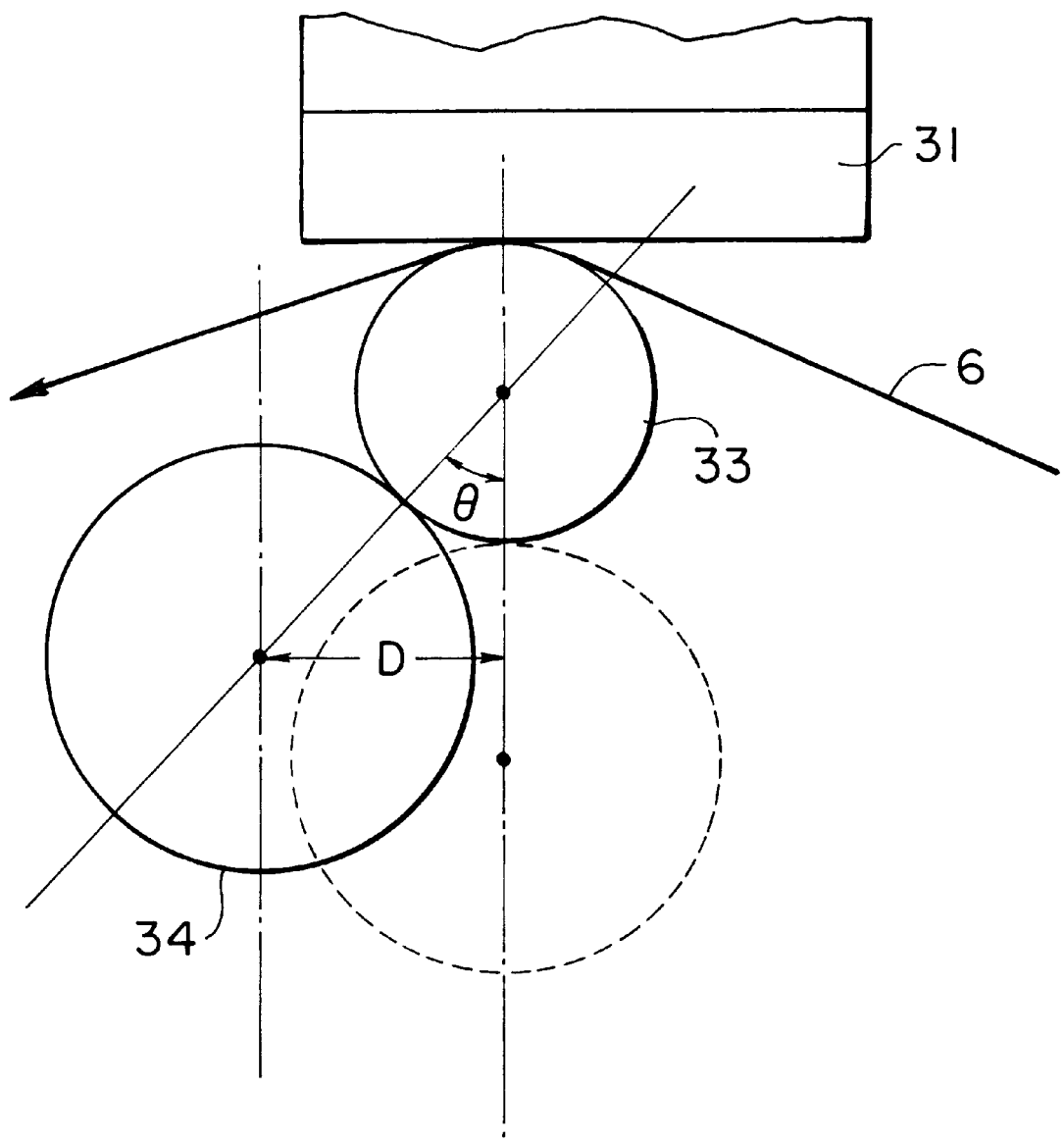
FIG. 3 is an enlarged schematic cross-sectional view of a platen roller and a back-up roller in explanation of the positional relationship of the two rollers.

As shown in FIG. 2, the image recording section 3 comprises the recording unit 31, the holding unit 32, the platen roller 33, a back-up roller 34, a disk brake 35, and a pressure application adjustment unit 36. In this recording section 3, images are recorded on the CTC film 6 transported from the film support section 2, as shown in FIG. 2 and FIG. 3. In FIG. 2, reference numeral 361 indicates a compression spring, and reference numeral 362 indicates an adjustment screw, which will be explained later.

The recording unit 31 for recording images on the CTC film 6 has a width capable of recording images, for instance, as large as the width of A0-size in a main scanning direction thereof.

Figure 4:
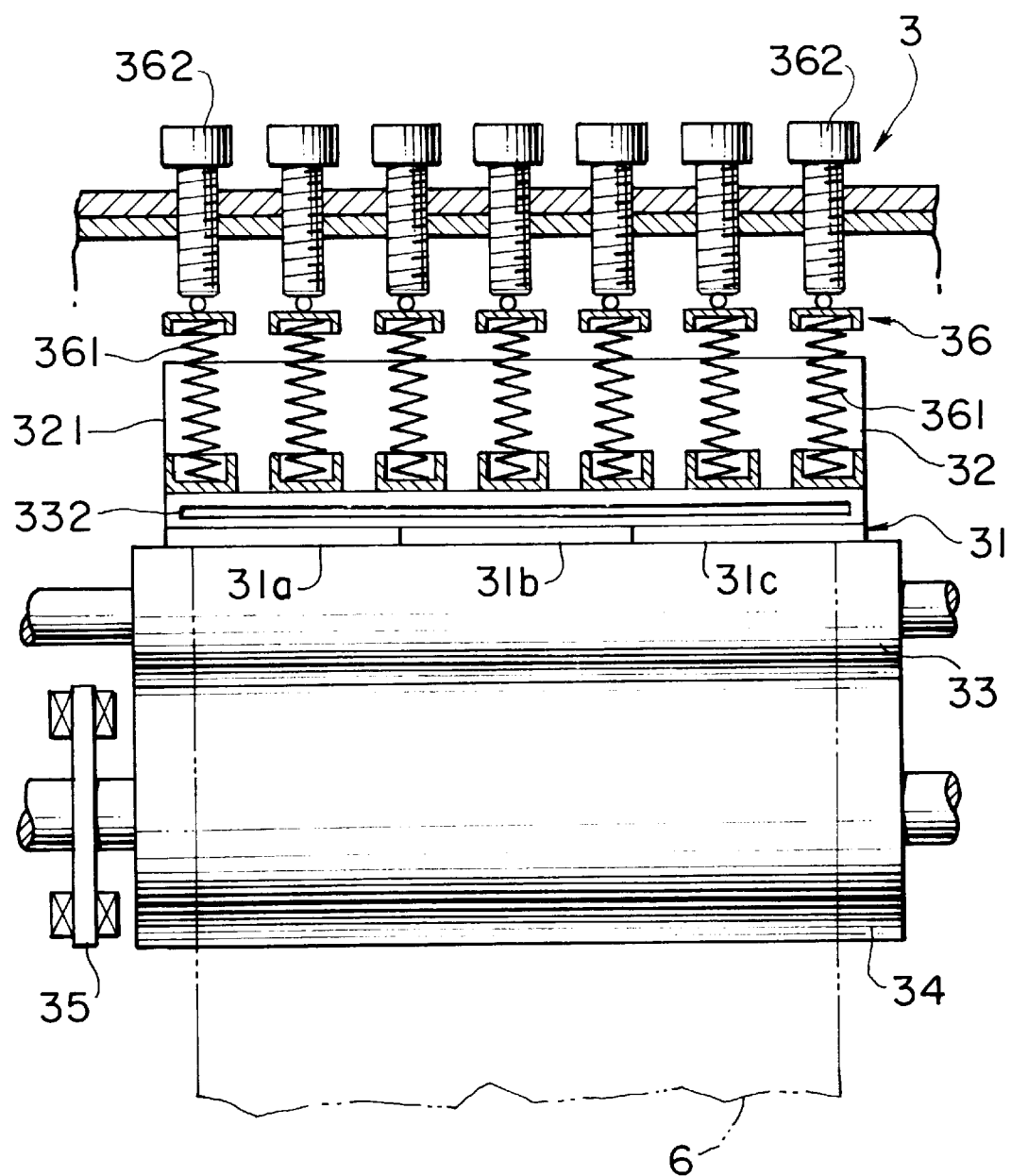
FIG. 4 is a schematic cross-sectional front view of the image recording apparatus shown in FIG. 1.

The above-mentioned wide recording can be attained by arranging a plurality of thermal heads, for instance, three thermal heads 31a, 31b and 31c, in series in the main scanning direction as illustrated in FIG. 4.

Figure 5:
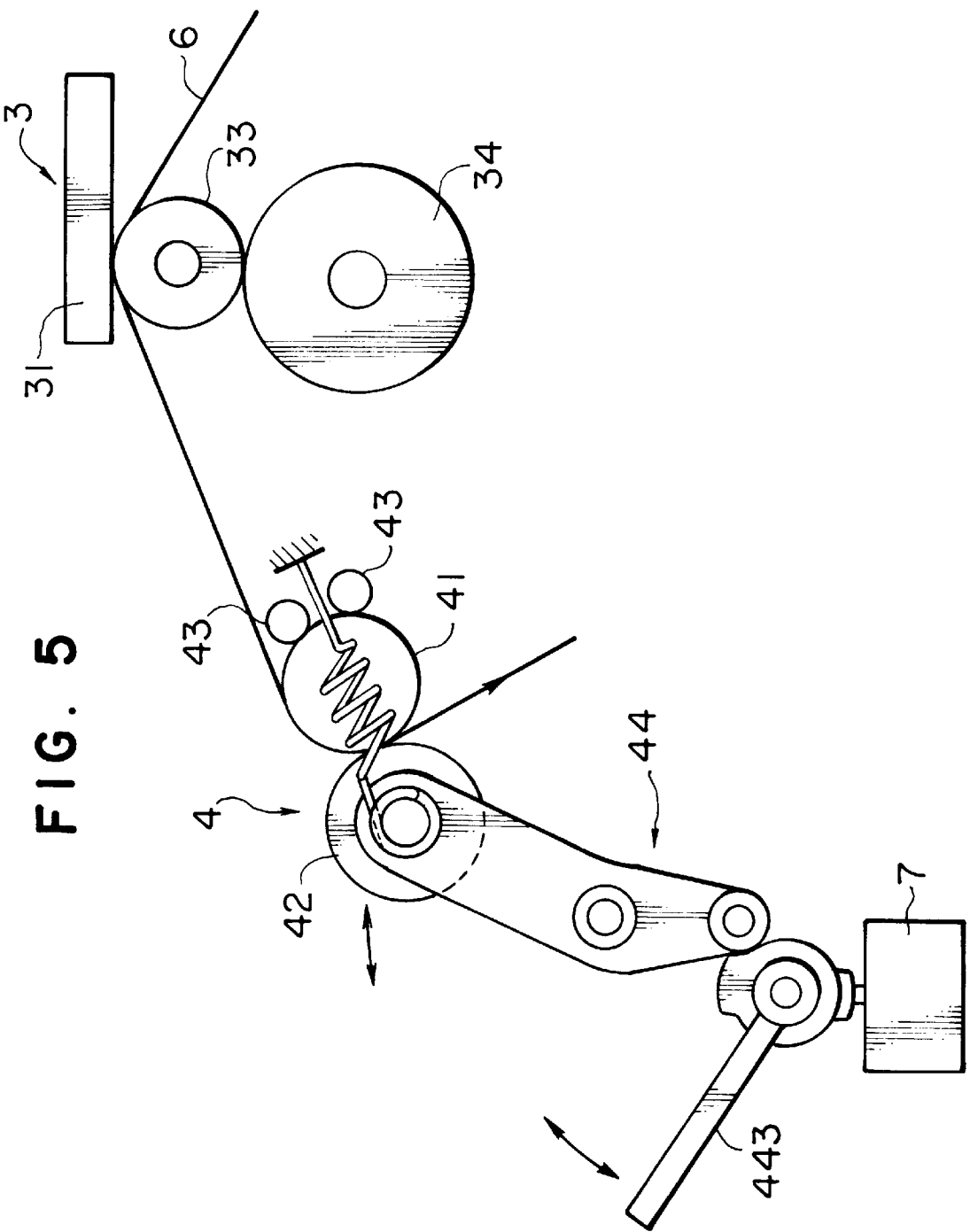
FIG. 5 is a schematic cross-sectional side view of a film transportation section of the image recording apparatus shown in FIG. 1.
Figure 6:
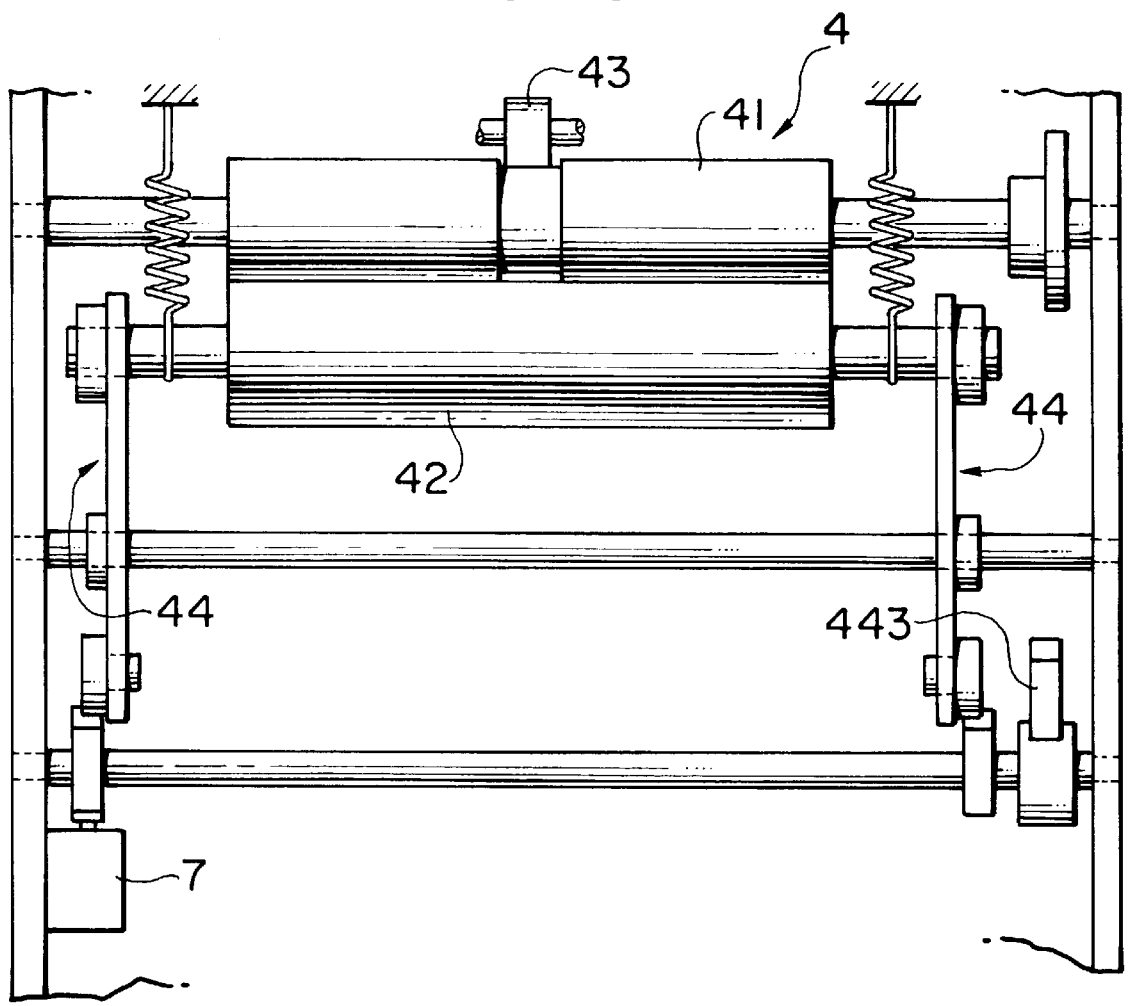
FIG. 6 is a schematic cross-sectional front view of a film transportation section of the image recording apparatus shown in FIG. 1.

With reference to FIG. 1 and FIG. 5, the film transport section 4 comprises the grit roller 41, the pressure-application roller 42, a pair of holding rollers 43 and a pressure application and releasing mechanism 44, and transports the CTC film 6 carried from the image recording section 3, with the application of an appropriate tension thereto.

The grit roller 41 is composed of a hollow steel pipe coated with fine hard granules like the surface of a sandpaper.

The pressure-application roller 42 brings the CTC film 6 into pressure contact with the surface of the grit roller 41 during the transportation of the CTC film 6.

The holding rollers 43 are brought into pressure contact with the grit roller 41 at a central portion in the width of the grit roller 41 at a position opposite to the pressure-contact position between the grit roller 41 and the pressure-application roller 42, and prevents the CTC film 6 from slacking on the grit roller 41 during the transportation of the CTC film 6.

The pressure application and releasing mechanism 44 has a mechanism for bringing the pressure-application roller 42 into pressure contact with the grit roller 41 or for releasing the pressure-application roller 42 from the grit roller 41.

When a printing mater film made by recording images on the CTC film 6 is output from the plotter 1, as shown in FIG. 5, the pressure application and release lever 443 is turned to bring the pressure application roller 42 into pressure contact with the grit roller 41, and the grit roller 41 is rotated, whereby the CTC film 6 is transported with the recording information being recorded on the CTC film 6. In FIG. 5, reference numeral 7 indicates a power source switch.

In the cutting section 5 shown in FIG. 1, the images recorded CTC film 6 is cut into a film with a predetermined length, for instance, by a rotary cutter (not shown).

The image recording operation in the present invention will now be explained.

With reference back to FIG. 1, the CTC film 6 held in the roll film holding section 2 is caused to pass through the image recording section 3 and the film transport section 4, and the leading edge portion of the CTC film 6 is placed beyond the cutting section 5.

Under such condition, the CTC film 6 is transported by rotating the grit roller 41 by energizing a drive apparatus therefor (not shown), and at the same time image information is input to the thermal heads 31a to 31c of the recording section 3 (refer to FIG. 4), whereby an image corresponding to the image information is recorded on the CTC film 6.

Figure 7:
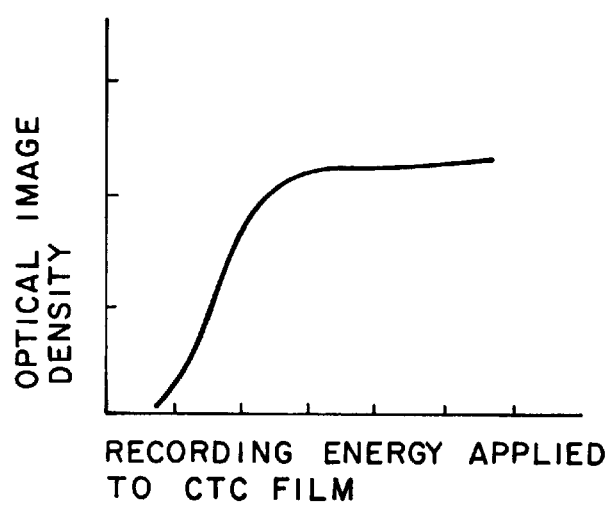
FIG. 7 is a characteristic graph showing the relationship between the optical image density and the recording energy applied to CTC film employed in the present invention.

FIG. 7 shows the relationship between the recording energy applied to the CTC film 6 and the optical image density (hereinafter referred to as the image density) obtained when the image is recorded on the CTC film 6.

The recording energy depends upon the energy applied to the thermal heads, but changes depending upon the temperature of the recording portion of each thermal head. The temperature of the recording portion of each thermal head has a significant effect on the image density of the image to be recorded.

The recording energy also depends upon the state of the contact of the thermal heads 31a to 31c with the surface of the CTC film 6. Thus, the state of the contact of the thermal heads 31a to 31c with the surface of the CTC film 6 also has a significant effect on the image density of the image to be recorded.

For example, when images are recorded on a CTC film of great width in the main scanning direction, such as an A0-size CTC film and the distribution of temperature in the main scanning direction of the recording unit 31 is not uniform, even if a predetermined constant amount of energy is applied to each thermal head, the resulting recording energy transmitted to the CTC film 6 is not uniform, so that the uniformity and resolution of images are affected by the non-uniform distribution of temperature.

For solving the above-mentioned problem, above the thermal heads, there may be provided a heat-uniformizing section comprising a heat dissipation block with a heat dissipation fin, and a heat pipe having high heat conductivity extending in the longitudinal direction of the thermal head, which is built in the heat dissipation block.

By providing such a heat pipe having high conductivity, the recording unit 31 can be maintained at a uniform temperature, so that the distribution of temperature in the direction of the width of the film is made uniform. As a result, images with excellent image quality can be obtained.

EXAMPLE 1

With reference to FIG. 4, a heat pipe 321 is built in a heat dissipation block 370 of the holding unit 32 along the thermal heads 31a to 31c for obtaining images with excellent image quality.

Figure 8:
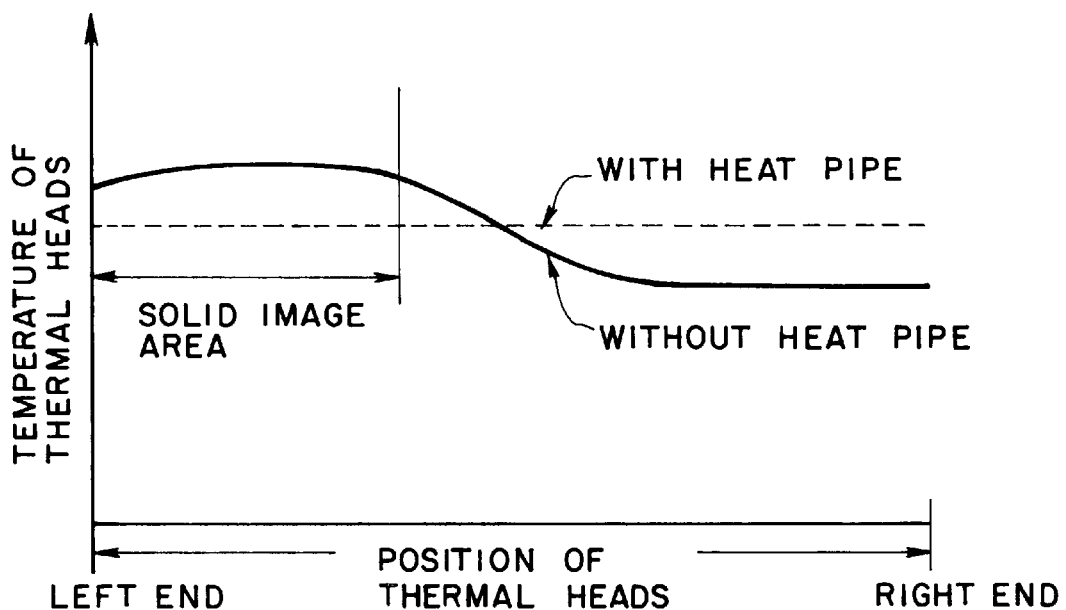
FIG. 8 is a graph showing the comparison between (1) the distribution of the temperature of thermal heads from the leftmost end to the rightmost end of the thermal heads employed in the present invention when a heat pipe 322 is provided, and (2) the distribution of the temperature of the same thermal heads when the above-mentioned heat pipe is not provided.

FIG. 8 shows the comparison between (1) the distribution of temperature of the thermal heads from the leftmost end to the rightmost end of the thermal heads when the above-mentioned heat pipe 322 is provided, and (2) the distribution of temperature of the same thermal heads when the above-mentioned heat pipe 322 is not provided. In FIG. 8, the solid line indicates the distribution of temperature of the thermal heads when the above-mentioned heat pipe is not provided, while the broken line indicates the distribution of temperature of the thermal heads when the above-mentioned heat pipe is provided.

Figure 9:
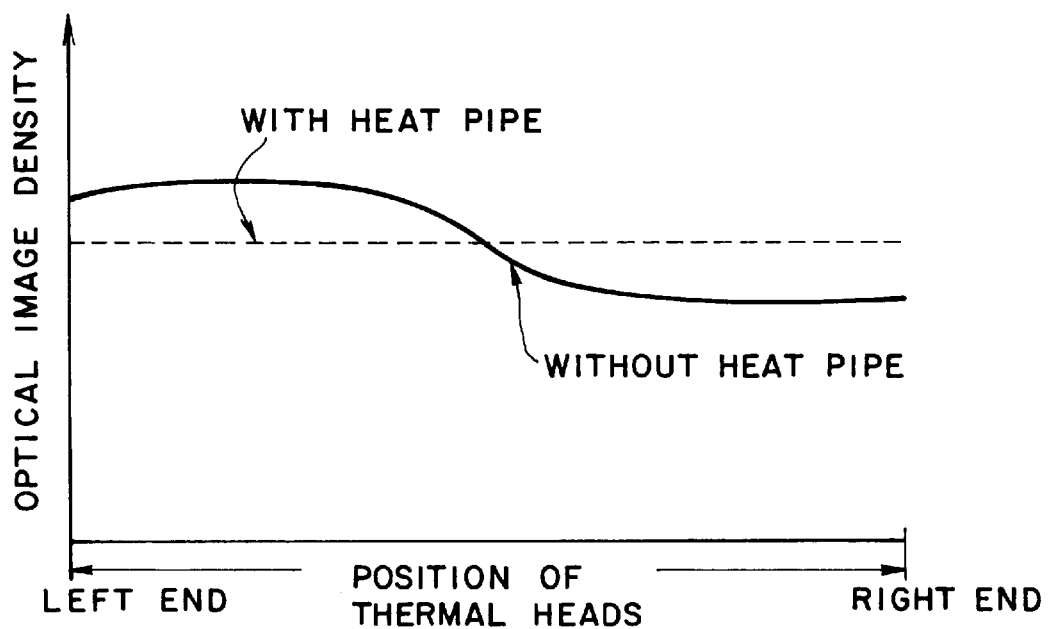
FIG. 9 is a graph showing the comparison between (1) the distribution of the image density obtained by the thermal heads from the leftmost end to the rightmost end of the thermal heads when the above-mentioned heat pipe 322 is provided, and (2) the distribution of the image density obtained by the same thermal heads when the above-mentioned heat pipe is not provided.

FIG. 9 shows the comparison between (1) the distribution of the image density obtained by the thermal heads from the leftmost end to the rightmost end of the thermal heads when the above-mentioned heat pipe 322 is provided, and (2) the distribution of the image density obtained by the same thermal heads when the above-mentioned heat pipe 322 is not provided. In FIG. 9, the solid line indicates the distribution of the image density obtained by the thermal heads when the above-mentioned heat pipe is not provided, while the broken line indicates the distribution of the image density obtained by the thermal heads when the above-mentioned heat pipe is provided.

Furthermore, the state of contact of the thermal heads 31a to 31c with the CTC film 6 depends upon the state of each of the thermal heads 31a to 31c.

More specifically, the surface of each of the thermal heads 31a to 31c has some undulations more or less, due to the non-uniformity of the flatness of its substrate or the non-uniformity of the thickness of a protective layer or the like therefor.

In such undulations at the surface of each of the thermal heads 31a to 31c, convex portions come into contact with the CTC film 6 with a larger contact pressure, while concave portions come into contact with the CTC film 6 with a smaller contact pressure, so that the resultant image density is not uniform.

In order to avoid this problem, in the present invention, at least surface layer of the platen roller 33 is made of a soft rubber with a hardness of 40 to 50 degrees, whereby even if the surface of each of the thermal heads 31a to 31c has the above-mentioned undulations, the CTC film 6 is brought into uniform and close pressure contact with the surface of each of the thermal heads 31a to 31c.

Figure 10:
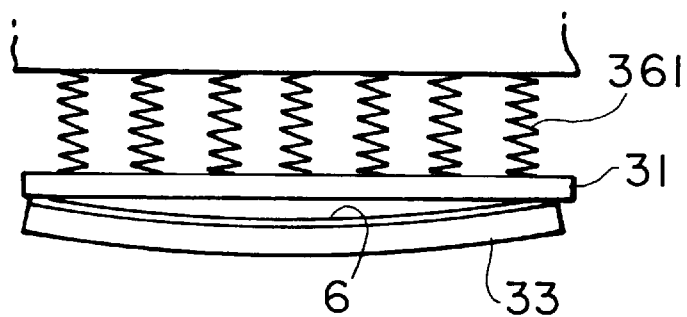
FIG. 10 is a schematic cross-sectional view of a platen roller in explanation of the deformation thereof.

However, even if the thermal heads 31a to 31c are brought into constant pressure contact with the platen roller 33, the platen roller 33 may slightly bend in a central portion as illustrated in FIG. 10. If this takes place, the contact pressure between the thermal heads 31a to 31c and the platen roller 33 differs in the central portion and the opposite end portions at the platen roller 33 and accordingly the image density differs in the corresponding central portion and the corresponding opposite end portions of the CTC film 6.

In order to prevent the platen roller 33 from bending as mentioned above, the back-up roller 34 with high rigidity is disposed in pressure contact with the platen roller 33 at a position opposite to the pressure contact position between the thermal heads 31a to 31c and the platen roller 33 as illustrated in FIG. 4, whereby the thermal heads 31a to 31c are uniformly brought into contact with the CTC film 6 over the entire width thereof, thus high quality images can be obtained.

Further as in the present invention, when the image recording unit 31 is separated from the film transportation section 4 including the grit roller 41, it is necessary that the distance between the image recording unit 31 and the film transportation section 4 be maintained constant in order to avoid the shifting of a predetermined recording position. In order to attain this, the disk brake 35 is connected to the rotary shaft of the back-up roller 34 so as to apply an appropriate brake load to the back-up roller 34, whereby the distance between the recording unit 3 and the film transportation section 4 can be maintained and accordingly the film transportation accuracy can be significantly improved.

EXAMPLE 2

As shown in FIG. 2, the platen roller 33 is made of a soft rubber with a hardness of 40 to 50 degrees, and the back-up roller 34 is disposed in pressure contact with the platen roller 33 at a position opposite to the position where the thermal heads 31a to 31c are in contact with the platen roller 33. The disk brake 35 is connected to the back-up roller 34 as shown in FIG. 4.

Figure 11:
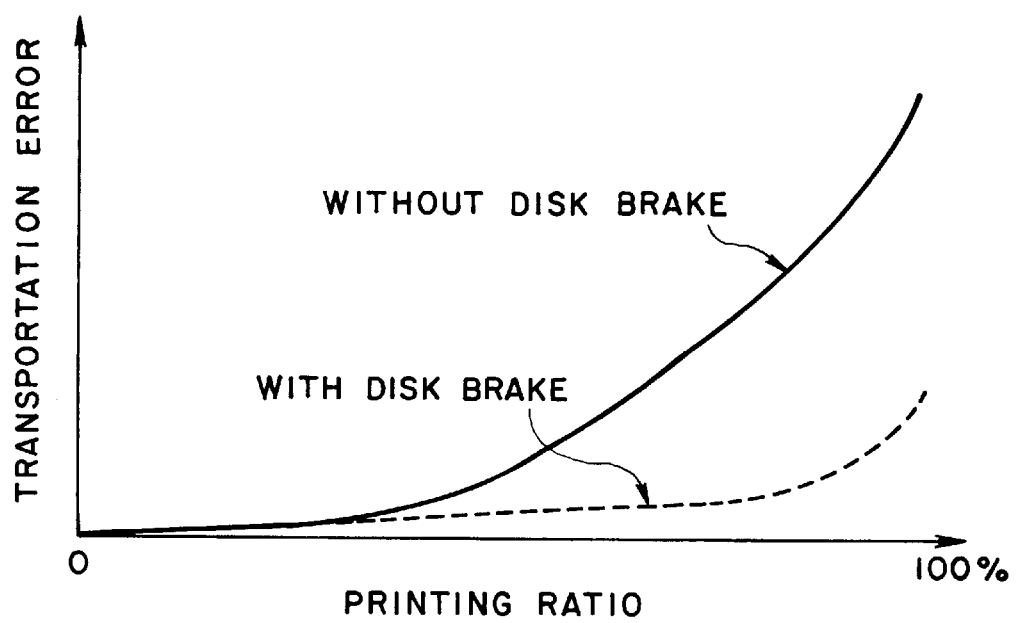
FIG. 11 is a graph showing how significantly the film transportation accuracy can be improved by the provision of a disk brake for use in the present invention.

FIG. 11 shows how significantly the film transportation accuracy can be improved by the provision of the disk brake 35. In FIG. 11, the solid line curve indicates the transportation error when the disk brake 35 is not provided, and the broken line curve indicates the reduction of the transportation error when the disk brake 35 is provided.

Figure 12:
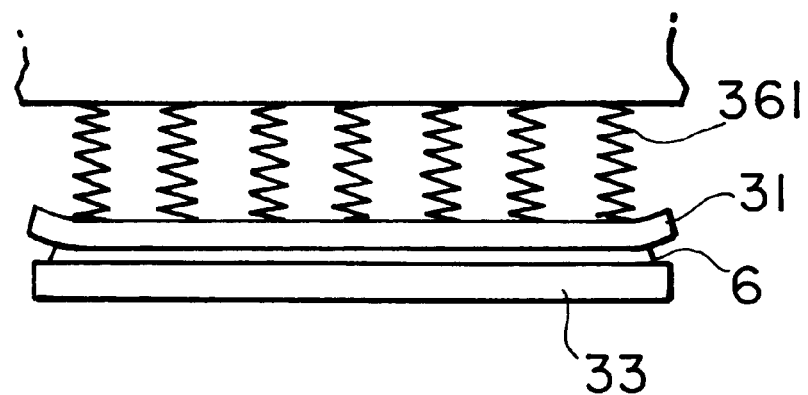
FIG. 12 is a schematic cross-sectional view of a platen roller and thermal heads in explanation of the deformation thereof.

As mentioned above, the bending of the platen roller 33 can be corrected by the provision of the above-mentioned back-up roller 34. However, when the thermal heads 31a to 31c are, for instance, as long as the width of A0 size paper, the contact between the thermal heads 31a to 31c and the platen roller 33 may become imperfect due to slight bending of the thermal heads, caused by thermal bimetal effect, as illustrated in FIG. 12.

The thus caused imperfect contact between the thermal heads 31a to 31c and the platen roller 33 can be corrected by the provision of a pressure application adjustment mechanism 36 comprising compression springs 361 and the adjustment screw 362, as shown in FIG. 4, which extends in the main scanning direction, in the upper portion of the holding unit 32 for the thermal heads 31a to 31c, with appropriate adjustment of the pressure applied by the pressure application adjustment mechanism 36. Thus, high quality images can be obtained.

EXAMPLE 3

Figure 13:
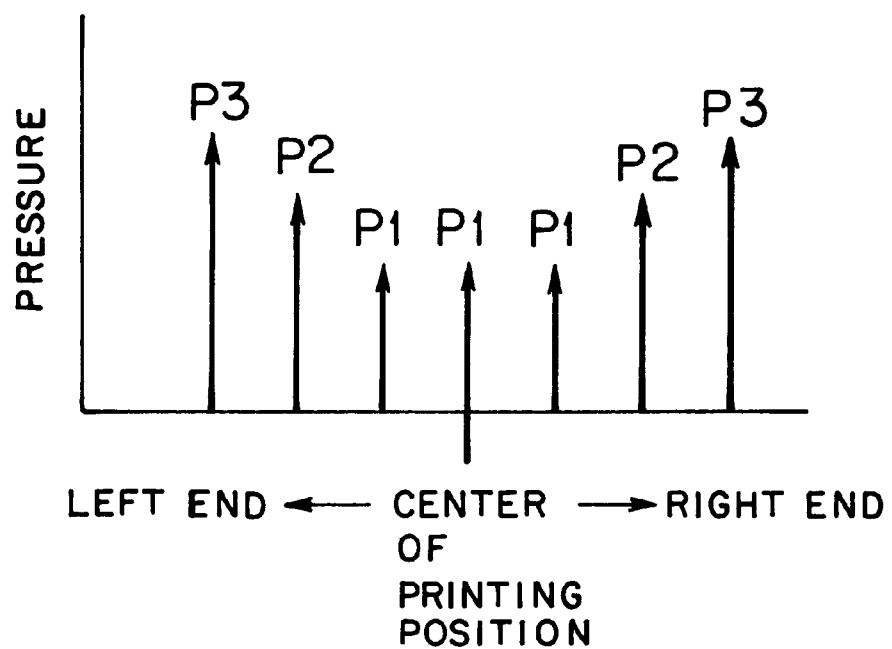
FIG. 13 is a diagram in explanation of the distribution of applied pressure in a pressure application and adjustment mechanism for use in the present invention.

The compression amount of the compression spring 361 is adjusted by the adjustment screw 363 of the pressure application adjustment mechanism 36 in such a manner that in the distribution of the applied pressure in the main scanning direction of the thermal heads 31a to 31c and the platen roller 33, the pressure in the opposite end portions is greater than that in the central portion as shown in the graph in FIG. 13, in which P1 to P3 respectively indicate the pressure to be applied.

In the course of the transportation of the CTC film 6, it may occur that the platen roller 33 is slightly shifted in the direction of the transportation of the CTC film 6 as shown by an imaginary platen roller 33' depicted by the broken lines. When the above shifting of the platen roller 33 takes place, the thermal heads 31a to 31c are not brought into contact with the CTC film at the right position for thermal printing with respect to the position of the platen roller 33. The result is that heat transfer from the thermal heads to the CTC film 6 cannot be carried out and uniform image density cannot be obtained. This problem becomes conspicuous particularly when the width of the CTC film is as great as the width of A0 size paper.

EXAMPLE 4

In order to prevent the above problem, in the present invention, as shown in FIG. 2, the back-up roller 34 is disposed in such a manner that the axis of rotation of the back-up roller 34 is shifted downstream of the direction of transportation of the CTC film 6 by a small distance D from a line connecting the contact point of the CTC film 6 with the platen roller 33 and the axis or rotation of the platen roller 33 as shown in FIG. 2, or with an angle θ as shown in FIG. 3, whereby even when the platen roller 33 is pulled by the transportation of the CTC film 6e the shifting of the platen roller 33 in the direction of the transportation of the CTC film 6 can be prevented, and accordingly the shifting of the thermal heads 31a to 31c from the right position for the contact with the CTC film 6 can be completely prevented, whereby excellent image formation can be carried out. The effect of the provision of he shifted back-up roller 34 is particularly conspicuous in the central portion of the platen roller 33.

Figure 14:
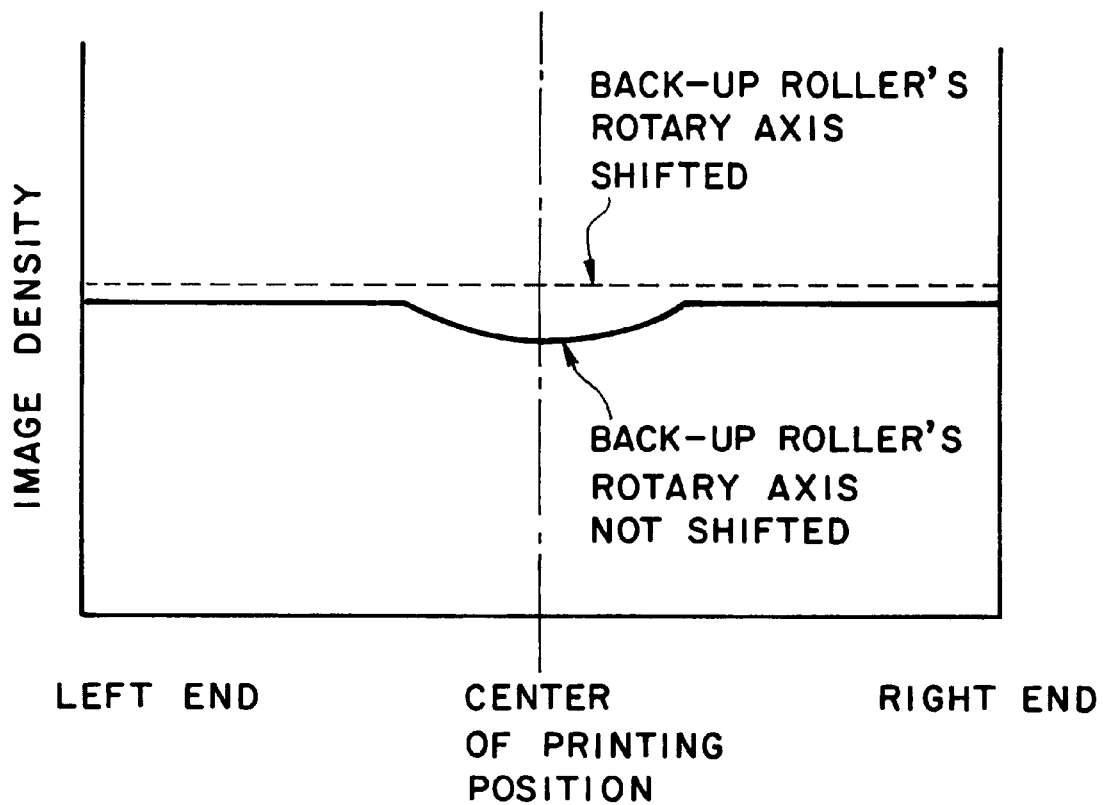
FIG. 14 is a graph showing the comparison between (1) the distribution of the image density obtained in the CTC film in the direction of the length of the platen roller when the rotary axis of the back-up roller is not shifted, and (2) the distribution of the image density obtained in the CTC film in the direction of the length of the platen roller when the rotary axis of the back-up roller is shifted.

FIG. 14 shows the comparison between (1) the distribution of the image density obtained in the CTC film 6 in the direction of the length of the platen roller 33 when the back-up roller 34 is not shifted as Mentioned above, which is Shown by the solid line, and (2) the distribution of the image density obtained in the CTC film 6 in the direction of the length of the platen roller 33 when the back-up roller 34 is shifted as mentioned above, which is shown by the broken line.

The image recording apparatus of the present invention is not always limited to the apparatus for preparing the printing master film for the above-mentioned textile printing, but can also be applied to the preparation of a printing master film for screen printing other than the textile printing, flexography, offset printing and the like. Japanese Patent Application No. 08-172839 filed Jun. 13, 1996 and Japanese Patent Application number 9-162125 filed Jun. 5, 1997 (as yet no application number having been assigned thereto) are hereby incorporated by reference.

What is claimed is:

1. An image recording apparatus comprising:

an image recording unit comprising at least one thermal head for recording images on a recording material;

a recording material transportation unit for transporting said recording material comprising a platen roller for bringing said recording material into contact with said thermal head so as to form images on said recording material, and a back-up roller which is in pressure contact with said platen roller at an opposite position to a position of said platen roller where said recording material is brought into contact with said thermal head by said platen roller, wherein the back-up roller is positioned downstream of the direction of transportation of said recording material with respect to a line connecting the contact point of said recording material with the platen roller and an axis of rotation of the platen roller; and a disk brake for controlling the rotation of said back-up roller, which is connected to said back-up roller.

2. The image recording apparatus as claimed in claim 1, further comprising a tension-application roller for applying tension to said recording material in the transport direction thereof, which is disposed downstream of said image recording unit with respect to the transportation direction of said recording material.

3. The image recording apparatus as claimed in claim 2, wherein said tension-application roller is a grit roller.

4. The image recording apparatus as claimed in claim 1, wherein said recording unit further comprises a pressure-application adjustment unit for applying pressure to said thermal head in such direction that said thermal head is brought into pressure contact with said recording material, and for adjusting said pressure.

5. The image recording apparatus as claimed in claim 1, wherein said platen roller comprises a rubber with hardness of 40 degrees to 50 degrees at least in an outer surface layer thereof.

6. The image recording apparatus un accordance with claim 1, further comprising a heat-uniformizing section comprising a heat dissipation block having a built-in heat pipe.

* * * * *